United States Patent [19]
Ngo

[11] Patent Number: 5,834,952
[45] Date of Patent: *Nov. 10, 1998

[54] OPEN-LOOP CURRENT MODE BIASING SCHEME FOR MR HEAD

[75] Inventor: Tuan V. Ngo, Eden Prairie, Minn.

[73] Assignee: VTC Inc., Bloomington, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 728,662

[22] Filed: Oct. 10, 1996

[51] Int. Cl.$^6$ ................................................. G01R 19/00
[52] U.S. Cl. ................................ 327/54; 327/538; 360/66
[58] Field of Search .............................. 327/87, 89, 578, 327/543, 323, 332, 538, 54; 360/66

[56] References Cited

U.S. PATENT DOCUMENTS

| | | | |
|---|---|---|---|
| 4,878,610 | 11/1989 | Jove et al. | 360/67 |
| 5,103,353 | 4/1992 | Jove et al. | 360/67 |
| 5,122,915 | 6/1992 | Klein et al. | 360/113 |
| 5,204,789 | 4/1993 | Jove et al. | 360/67 |
| 5,444,579 | 8/1995 | Klein et al. | 360/67 |
| 5,534,818 | 7/1996 | Peterson | 327/545 |
| 5,635,868 | 6/1997 | Aiello et al. | 327/538 |

*Primary Examiner*—Timothy P. Callahan
*Assistant Examiner*—Jung Ho Kim
*Attorney, Agent, or Firm*—Kinney & Lange, P.A.

[57] ABSTRACT

A biasing circuit for a two terminal sensing element has two separate biasing elements. Both biasing elements are controlled by a transconductance feedback circuit that controls feedback currents based upon a voltage associated with the sensing element. Both biasing elements also receive an activation value from an activation circuit. The activation value activates both biasing elements directly, without using the feedback loop.

24 Claims, 3 Drawing Sheets

OPEN-LOOP CURRENT MODE BIASING SCHEME FOR MR HEAD

BACKGROUND OF THE INVENTION

The present invention relates to biasing a magnetic-field sensing element. In particular, the present invention relates to biasing a magneto-resistive head with two separate biasing elements that are directly controlled by an initial activation circuit and a feedback circuit.

The present invention is typically used in a computer disc drive as part of a "read" channel that includes a magnetic-field sensing element used to "read" information stored on a magnetic disc. The information is stored on the disc as a series of small magnetic domains which produce a series of small localized magnetic fields. To "read" the stored information, the sensing element passes over the disc and creates an electrical signal based on the direction of the magnetic fields. The remainder of the read channel converts the electrical signal into a digital signal that is decoded to reproduce the stored information.

One type of sensing element, known as a magneto-resistive or MR head, "reads" the stored magnetic information by using the magnetic fields to change the electrical resistance of a material within the head. To convert the changing resistance into a usable voltage signal, MR heads are typically biased with a current that creates a voltage drop across the resistive portion of the MR head. The bias current is controlled so that any changes in the voltage drop across the MR head are attributed to changes in the resistance of the head. Thus, in this configuration, the voltage across the head tracks the changes in the magnetic fields, making the voltage useful as a read signal.

Typically, MR heads are biased by two current sources. One current source is connected between the positive power supply and a first terminal of the MR head and the other current source is connected between the negative power supply and a second terminal of the MR head. Both current sources help to filter noise found in the power supplies that would otherwise degrade the read signal from the MR head. In order to function properly, the two current sources must bias the MR head so that the positive voltage at one terminal of the head and the negative voltage at the other terminal of the head have the same magnitude. When biased properly, changes in the resistance of the head do not change this relationship. In otherwords, changes in the voltage drop across the head result in changes to the voltages at both terminals, with each terminal changing by the same amount but in different polarities.

To ensure that the two current sources properly bias the head, the prior art has developed a feedback loop which adjusts one current source until the two sources together provide the proper bias. The feedback loop typically provides a feedback voltage which is an amplified version of a voltage at the center of a resistance bridge placed across the MR head. The resistance bridge is constructed from two identical resistors, with the node between the two resistors serving as the centerpoint of the bridge. When the two current sources produce the desired bias currents, the voltage at the centerpoint of the resistance bridge is zero, and the voltage at the two terminals of the head have identical magnitudes. When the two current sources do not match, the voltage at the centerpoint of the resistance bridge is positive or negative depending on the type of mismatch.

In the feedback loop, the voltage at the centerpoint of the resistance bridge is typically amplified by an operational amplifier, which has its non-inverting input tied to the centerpoint of the resistance bridge and its inverting input tied to ground. The output of the operational amplifier is coupled to a control node of a current source so that the amplified voltage causes the current source to modify its output current. The modifications to the current source bring the voltage at the centerpoint closer to ground. Thus, the resistance bridge and the operational amplifier act as a negative feedback loop that continually adjusts one of the current sources so that the two current sources together properly bias the MR head.

An example of a prior art circuit used to bias an MR head is shown in FIG. 1 where resistor RMR represents the variable resistance of the MR head. The voltage drop across the MR head is taken from the two terminals of the MR head which are connected to the bases of transistors Q1 and Q2 respectively. Transistors Q1 and Q2 form a differential pair in a differential amplifier that is completed by resistors R1 and R2, capacitor C1, and current sources IR1 and IR2. The outputs of the differential amplifier are taken at the collectors of transistors Q1 and Q2 and represent an amplified version of the voltage drop across the MR head.

The MR head is biased by two current sources; an upper current source constructed from PNP transistor Q4, resistor R4 and capacitor C3 and a lower current source constructed from NPN transistor Q3, resistor R3 and capacitor C2. The lower current source is activated by current source IMR, resistor R8, and transistor Q5, which has its base and collector coupled to the base of transistor Q3. The upper current source is activated be a feedback loop that includes operational amplifier 20, resistor R7 and a resistance bridge of resistors R5 and R6. The non-inverting input of operational amplifier 20 is coupled to the centerpoint of the resistance bridge located at the node between resistors R5 and R6. The inverting input of operational amplifier 20 is coupled to ground and the output of the operational amplifier is tied to resistor R7, which has its other end coupled to the base of transistor Q4.

When information is being written to the disc or when the disc drive is not in use, current source IMR does not provide current and the sensing circuit of FIG. 1 is idle. In the idle state, transistors Q5, Q3 and Q4 are off so that no current is supplied to the MR head. When the disc drive transitions to a read state, the current from current source IMR increases, causing the base-emitter junctions of transistors Q5 and Q3 to become forward biased so that they both conduct current through their collectors. The collector current of transistor Q3 pulls current through resistor R5 causing the voltage at the non-inverting input of operational amplifier 20 to drop below ground and thereby causing the output of operational amplifier 20 to drop significantly. This drop in voltage at the output of operational amplifier 20 is carried through resistor R7 to the base of PNP transistor Q4 and forward biases the emitter-base junction of transistor Q4, causing a collector current to flow from transistor Q4 to the MR head and the resistance bridge. The output of operational amplifier 20 remains negative until the collector current of transistor Q4 becomes large enough to drive the voltage at the resistance bridge centerpoint to ground.

The negative feedback loop created by the resistance bridge of resistors R6 and R5, operational amplifier 20 and resistor R7, constantly adjusts the collector current of transistor Q4 so that the centerpoint is at ground. If the collector current of transistor Q4 becomes too large relative to the collector current of transistor Q3, a positive voltage develops at the non-inverting input of operational amplifier 20. This positive voltage is amplified and output to the end of resistor R7 causing a reduction in the base current flowing from transistor Q4 and thus a reduction in the collector current of transistor Q4. The reduction in the collector current of transistor Q4 continues until the voltage at the centerpoint returns to ground.

If the collector current of transistor Q4 is too small relative to the collector current of transistor Q3, the voltage at the non-inverting input of operational amplifier 20 is negative and the output voltage of the operational amplifier is negative. This increases the base current of transistor Q4 and thus increases the collector current of transistor Q4 until the voltage at the centerpoint returns to ground.

The prior art biasing system of FIG. 1 has numerous deficiencies. For instance, the system of FIG. 1 has a slow switching time when converting from an idle state or write state to a read state. The initial increase in current from current source IMR during switching does not instantly appear at transistor Q4. Instead, the activation of transistor Q4 is delayed by the voltage feedback loop. Specifically, resistor R7 and capacitor C3 create an RC constant that inhibits changes in the operational amplifier's output, thereby inhibiting changes in the base and collector currents of transistor Q4.

In addition, the operational amplifiers used in prior art have many characteristics that are undesirable. For instance, the operational amplifiers are device intensive and require large compensating capacitors to operate effectively. Operational amplifiers also create inaccuracies between the current levels of the two bias current sources because the amplifiers include offset voltages and internal resistances which vary slightly between operational amplifiers. These variations make it difficult to anticipate how each operational amplifier will affect the circuit. In addition, operational amplifiers have poor common mode rejection ratios and poor power supply rejection ratios which directly reduce the common mode rejection ratio and power supply rejection ratio of the MR head sensing circuit.

SUMMARY OF THE INVENTION

The present invention is a biasing circuit for a resistive load, especially a resistive sensing element such as a magneto-resistive head. The biasing circuit has two current sources, one coupled to each end of the resistive load, and a feedback circuit which adjusts both current sources so that their output currents cause a point in the resistive load to have a voltage of zero.

In preferred embodiments, the feedback circuit includes a transconductance circuit which creates feedback currents based on a voltage. The voltage is preferably taken from the centerpoint of a resistance bridge placed across the resistive load. The feedback currents change the output currents of the two current sources by increasing one output current and decreasing the other output current. In some embodiments, the feedback currents are divided from a single current source with the transconductance circuit controlling the distribution of the single current between the two feedback currents.

In addition, the feedback circuit of the present invention is preferably open such that both current sources are initially activated without using the feedback circuit. This open-loop configuration reduces the switching time associated with activating the MR head during transitions from writing information to reading information.

DETAILED DESCRIPTION OF THE PREFERRED EMBODIMENTS

Figure 1:
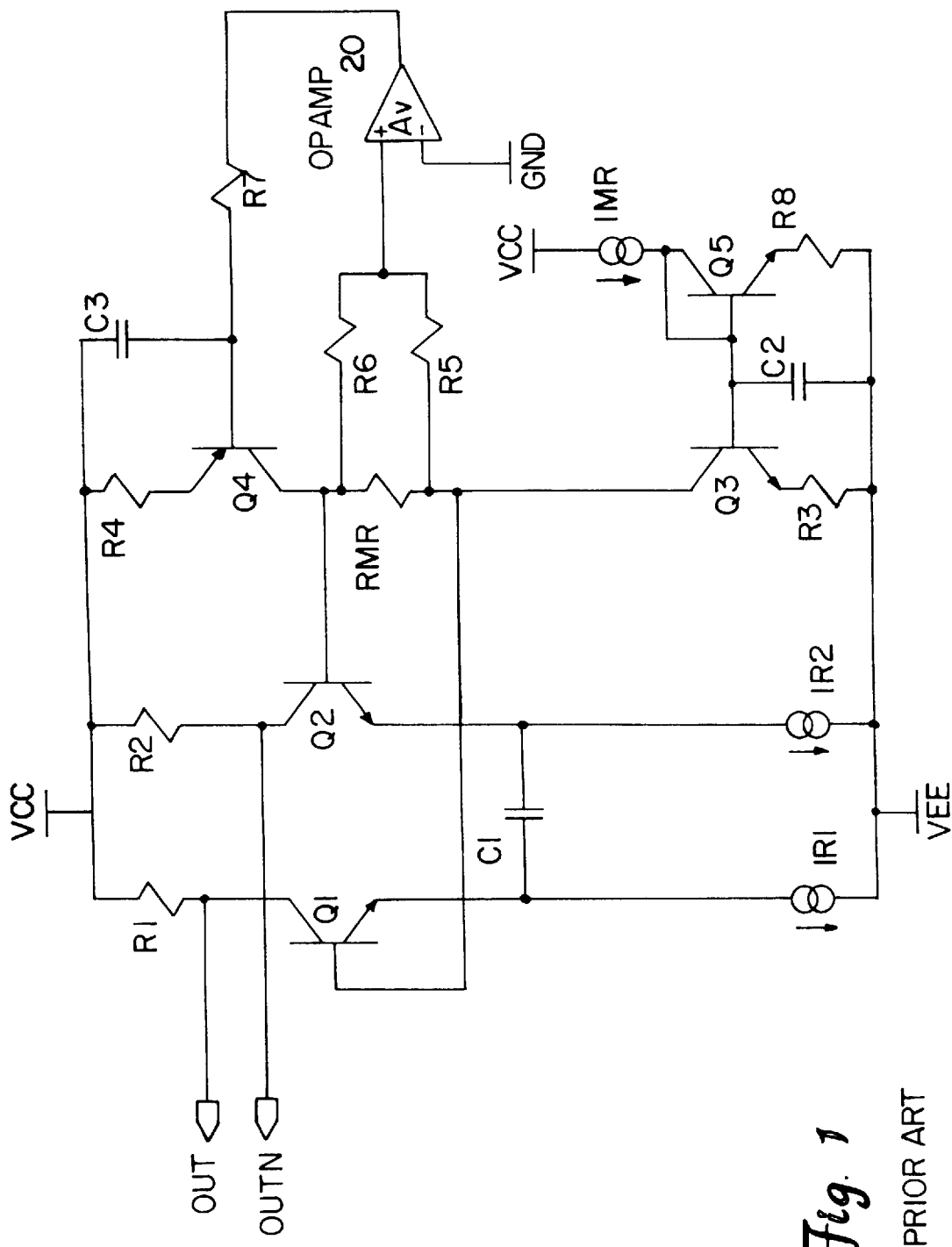
FIG. 1 is a diagram of a prior art MR sensing circuit.
Figure 2:
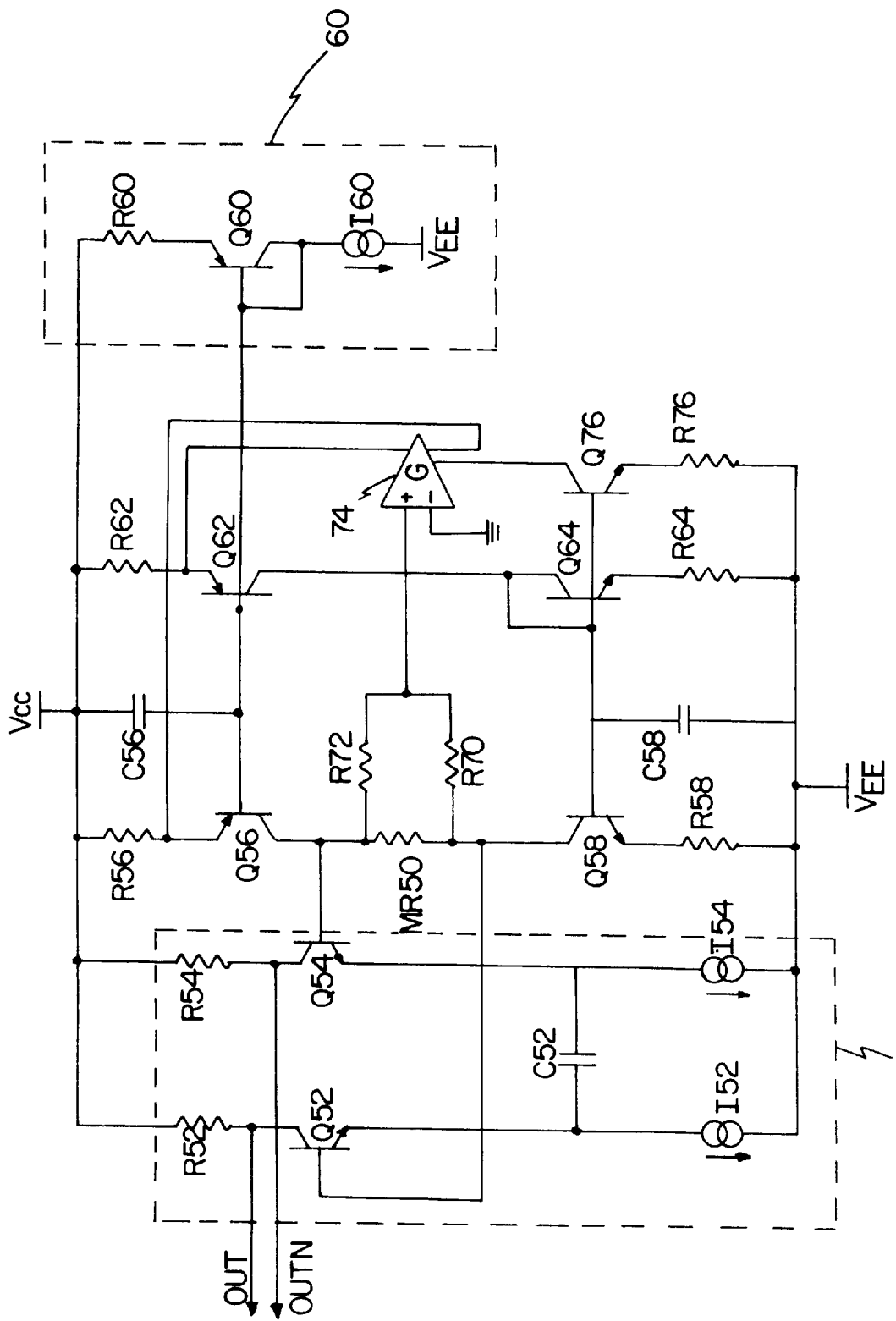
FIG. 2 is a diagram of an MR head sensing circuit of the present invention.

FIG. 2 is a diagram of a sensing circuit of the present invention in which resistor MR50 is the resistance of an MR head used in sensing magnetic field transitions over a disc. The two terminals of MR50 are coupled to a differential amplifier 48 constructed from NPN transistors Q52 and Q54, resistors R52 and R54, current sources I52 and I54 and capacitor C52. Resistors R52 and R54 are coupled between upper power supply $V_{CC}$ and the collectors of transistors of Q52 and Q54 respectively. Capacitor C52 is coupled between the emitters of transistors Q52 and Q54. Current sources I52 and I54 are coupled between lower power supply $V_{EE}$ and the emitters of transistors Q52 and Q54 respectively. The base of transistor Q52 is coupled to the lower voltage terminal of MR head MR50 and the base of transistor Q54 is coupled to the upper voltage terminal of MR head MR50. The outputs of differential amplifier 48 are taken from the collectors of transistors Q52 and Q54.

When the voltage difference between the bases of transistors Q52 and Q54 increases, the collector current of transistor Q54 increases and the collector current of transistor Q52 decreases. The increased collector current of transistor Q54 causes an increase in the voltage drop across resistor R54 and thus lowers the voltage at transistor Q54's collector. A decrease in the collector current of transistor Q52 causes a reduction in the voltage drop across resistor R52 and thus increases the voltage at the collector of transistor Q52. Thus, when the voltage across MR head MR50 increases, the voltage difference between the collector of transistor Q52 and the collector of transistor Q54 also increases. Similarly, when the voltage drop across MR head MR50 decreases, the voltage difference between the collectors of transistors Q52 and Q54 decreases. Thus, the output of differential amplifier 48 is an amplified version of the voltage drop across MR head MR50.

Transistor Q56, resistor R56 and capacitor C56 operate as a current source for the upper voltage terminal of MR head MR50. Transistor Q56 is a PNP transistor with its collector coupled to the upper voltage terminal of MR head MR50, its emitter coupled to one terminal of resistor R56 and its base coupled to one terminal of capacitor C56. Resistor R56 is coupled between upper power supply $V_{CC}$ and the emitter of transistor Q56. Capacitor C56 is coupled between upper power supply $V_{CC}$ and the base of transistor Q56. Capacitor C56 and resistor R56 filter noise found in upper power supply $V_{CC}$ so that the noise is not transmitted to MR head MR50.

A current source for the lower voltage terminal of MR head MR50 is constructed from transistors Q62, Q64 and Q58, resistors R62, R64 and R58, and capacitor C58. Transistor Q58 is an NPN transistor with its collector coupled to the lower voltage terminal of MR head MR50, its emitter coupled to one terminal of resistor R58 and its base coupled to one terminal of capacitor C58. Resistor R58 is coupled between the emitter of transistor Q58 and the lower power supply $V_{EE}$. Capacitor C58 is coupled between the base of transistor Q58 and lower power supply $V_{EE}$. Capacitor C58 and resistor R58 filter noise found in lower power supply $V_{EE}$.

The base of transistor Q58 is further coupled to the base and collector of NPN transistor Q64. The emitter of transistor Q64 is connected to one end of resistor R64 which has its other end connected to lower power supply $V_{EE}$. The collector of transistor Q64 is connected to the collector of PNP transistor Q62 which has its emitter connected to one end of resistor R62. The other end of resistor R62 is connected to upper power supply $V_{CC}$.

Current is first initiated in transistors Q56 and Q62 through an initiator circuit 60. Initiator circuit 60 includes current source 160, which is coupled between lower power supply $V_{EE}$ and the base and collector of PNP transistor Q60. The emitter of transistor Q60 is tied to one terminal of resistor R60, which has its second terminal tied to upper power supply $V_{CC}$. When active, current source 160 activates transistor Q60, causing currents to flow through transistor Q60's emitter and collector.

The base of transistor Q60 is tied to the base of PNP transistor Q62. Transistors Q62 and Q60 are preferably identical devices and resistors R62 and R60 preferably have identical resistance values. As is well known in the art, the similarity between these components causes the collector current flowing through transistor Q60 to be mirrored into the collector current of transistor Q62, i.e., the collector current of transistor 062 nearly matches the collector current of transistor Q60.

Since the collector of PNP transistor Q62 is coupled to the base and collector of NPN transistor Q64, the collector current of transistor Q64 is nearly identical to the collector current of transistor Q62 and thus is nearly identical to the collector current of transistor Q60.

Transistors Q64 and Q58 form another current mirror where transistor Q64 acts as a driver or originating transistor and transistor Q58 acts as a reflecting transistor. Transistor Q58 preferably conducts 10 times as much current through its emitter as transistor Q64 for a given base-emitter voltage. In addition, resistor R58 is preferably one-tenth of the size of resistor R64. Under this arrangement, the collector current of transistor Q58 is initially set to 10 times the collector current of transistor Q64. Since the collector current of transistor Q64 matches the collector current of transistor Q60, the collector current of transistor Q58 is approximately 10 times the collector current of transistor Q60.

The base of transistor Q60 is also connected to the base of transistor Q56 forming a current mirror between transistors Q60 and Q56. In preferred embodiments, transistor Q56 is larger than transistor Q60 so that transistor 56 has an emitter current that is nearly ten times as great as the emitter current of transistor Q60 for a given base-emitter junction voltage. In addition, resistor R56 is preferably one tenth of the size of resistor R60. Under this preferred embodiment, the collector current of transistor Q56 is initially set to nearly ten times the collector current of transistor Q60.

From the discussion above, it can be seen that under the present invention, two bias-current sources are initially activated independently of the bias current passing through MR head MR50. In otherwords, under the present invention both bias currents are initially set without using a feedback loop. This decreases the switching time needed to switch from an idle state to a read state because the delays inherent to the feed back loop are eliminated.

Once the bias currents have been initiated, the present invention adjusts both current sources so that the voltages at the two terminals of the MR head have the same magnitude but different polarities. This adjustment is accomplished using a matching feedback loop that begins with a voltage taken from the centerpoint of a balanced resistance bridge coupled across the two terminals of MR head MR50. The resistance bridge has two, preferably identical, resistors R70 and R72 coupled in series across head MR50 to form respective feedback nodes at the terminals of head MR50. When the two current sources are producing the correct amount of current relative to each other, the voltage at the node between resistors R70 and R72 is at ground. When the upper current source creates more than the desired current relative to the lower current source, the voltage at the centerpoint node becomes positive. When the upper current source creates less than the desired current, the voltage at the centerpoint node becomes negative.

The centerpoint node is coupled to the non-inverting input of transconductance amplifier 74 which has its inverting input tied to ground. Transconductance amplifier 74 has two outputs, one of which is coupled to a first feedback node at the emitter of transistor Q56 and one of which is coupled to a second feedback node at the emitter of transistor Q62. Both outputs produce a feedback current with the total current flowing through the two outputs equal to a bias current created by transistor Q76 and resistor R76. Although the total current in the two outputs is controlled by transistor Q76, the distribution of that current between the two outputs is controlled by transconductance amplifier 74.

The collector of transistor Q76 is coupled to transconductance amplifier 74 and the emitter of transistor Q76 is coupled to one terminal of resistor R76. The other terminal of resistor R76 is coupled to the lower power supply $V_{EE}$. The base of transistor Q76 is coupled to the bases of transistors Q58 and Q64, so that the collector current of transistor Q76 tracks with the collector currents of transistors Q64 and Q58. Thus, the bias current of transconductant amplifier 74 tracks with the bias currents of transistors Q58 and Q56, independent of process, supply voltage, and temperature variations. In preferred embodiments, transistor Q76 is one-fifth the size of transistor Q58 and the resistance of resistor R76 is five times larger than the resistance of resistor R58. With these device parameters, the collector current of transistor Q76 preferably is one-fifth the collector current of transistor Q58.

Transconductance amplifier 74 regulates the percentage of the transconductance bias current assigned to each transconductance output on the basis of the potential difference between the voltage at the centerpoint of the resistance bridge and ground. For a positive voltage at the centerpoint, which occurs when transistor Q56 produces too much current relative to transistor Q58, transconductance amplifier 74 increases the current taken at the emitter of transistor Q56 and decreases the current taken at the emitter of transistor Q62. As the current taken at the emitter of transistor Q56 increases, the current through resistor R56 increases and the voltage at the emitter of transistor Q56 decreases. The voltage reduction at the emitter of transistor Q56, lowers transistor Q56's emitter-base junction voltage, which lowers the collector current of transistor Q56.

Decreasing the amount of current taken at the emitter of transistor Q62 causes less current to flow through resistor R62 and thus increases the emitter voltage of transistor Q62. This increases the emitter-base voltage of transistor Q62 and thereby increases that transistor's collector current. The increased collector current of transistor Q62 is mirrored to transistor Q58 through transistor Q64 as discussed previously. Thus, the collector current of transistor Q58 increases and the collector current of transistor of Q56 decreases if the voltage at the centerpoint of the resistance bridge becomes positive. This forces the collector current of transistor Q56 and the collector current of transistor Q58 toward each other so that they more closely match each other and this thereby causes a reduction in the positive voltage at the centerpoint of the resistance bridge.

When the voltage at the centerpoint of the resistance bridge is negative, transistor Q56 is not producing enough current relative to the current of transistor Q58. A negative voltage at the non-inverting input of transconductance amplifier 74 causes the amplifier to decrease the amount of current taken at the emitter of transistor Q56 and increases the amount of current taken at the emitter of transistor Q62. Through the processes discussed above, this increases the collector current of transistor Q56 and decreases the collector current of transistor Q62. The decrease in collector current of transistor 62 is mirrored to the collector current of transistor Q58 through transistor Q64. Thus, with a negative voltage at the non-inverting input of transconductance amplifier 74, the collector current of transistor Q58 is decreased and the collector current of transistor Q56 is increased until the voltage at the centerpoint of the resistance bridge is equal to ground.

The present invention overcomes many of the negative aspects of prior MR head biasing schemes. In particular, the present invention improves accuracy by eliminating operational amplifier offset voltages and the need to match an operational amplifier's internal resistance with an external resistor. In addition, since transconductance amplifier 74 is less complex than an operational amplifier and because it does not require a compensating capacitor, the overall circuit design of the present invention is less complex. Further, because the feedback current signals are connected to the emitters of transistors Q56 and Q62, the RC constant of the prior art has been removed from the feedback loop.

Figure 3:
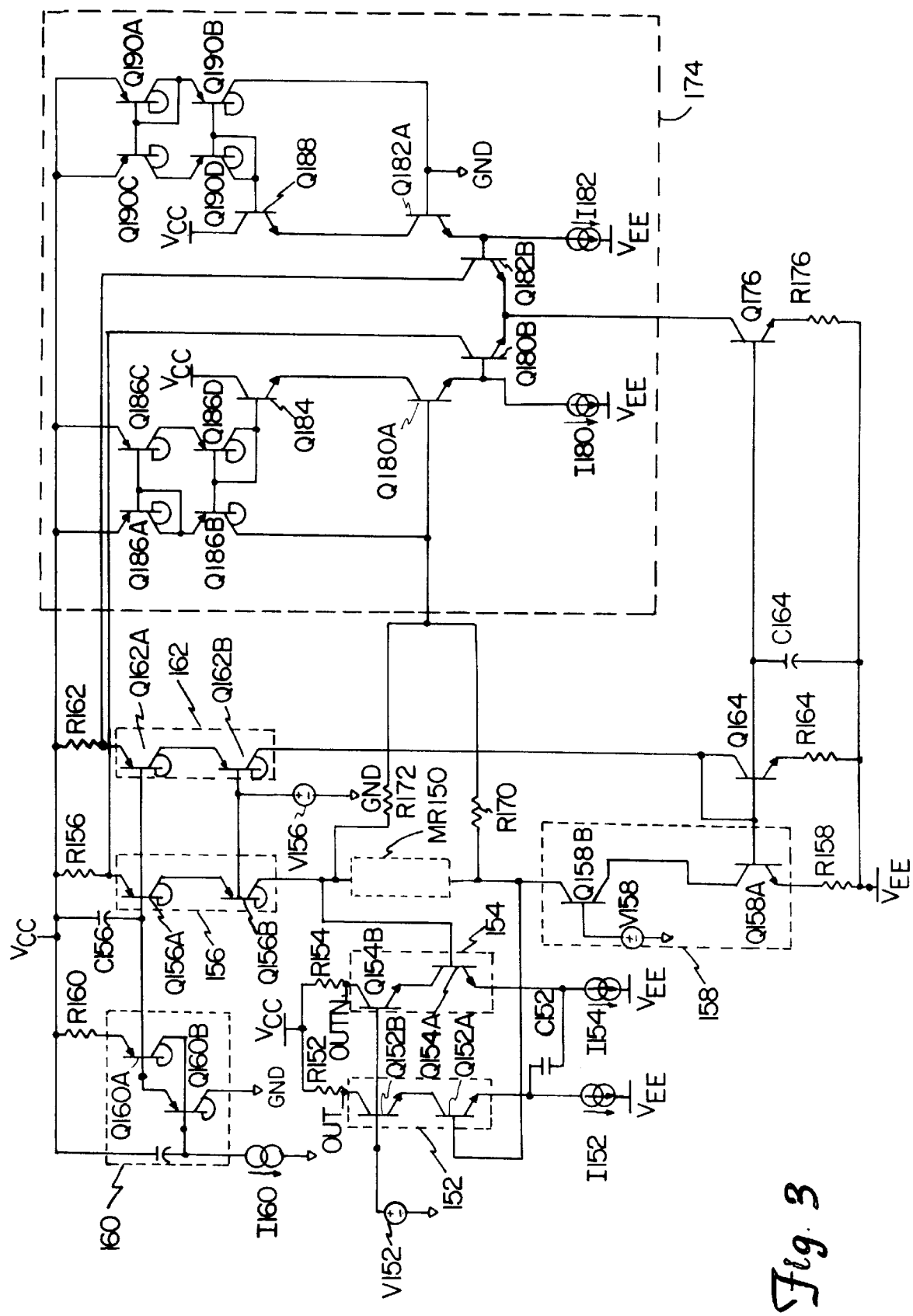
FIG. 3 is a diagram of an implementation of the MR head sensing circuit of FIG. 2.

FIG. 3 is a diagram of one implementation of FIG. 2's sensing circuit. In FIG. 3, MR150 represent the resistance of an MR head. The voltage across MR head MR150 is measured by a differential amplifier constructed from the transistors of blocks 152 and 154, resistors R152 and R154, current sources I152 and I154, capacitor C152, and reference voltage V152.

Block 152 includes transistors 152A and 152B. Transistor 152A has its base coupled to the lower terminal of MR150 and its emitter coupled to current source I152. Transistor 152B has it emitter tied to the collector of transistor 152A, its base coupled to reference voltage V152, and its collector coupled to one terminal of resistor R152. Block 154 includes transistors Q154A and Q154B. Transistor Q154A has its base coupled to the upper voltage terminal of MR150 and its emitter coupled to current source I154. Transistor Q154B has its collector coupled to resistor R154, its emitter coupled to the collector of transistor Q154A and its base coupled to reference voltage V152.

The differential amplifier of FIG. 3 operates in a manner similar to differential amplifier 48 of FIG. 2, with the transistors of blocks 152 and 154 performing the functions of transistors Q52 and Q54 of FIG. 2. Specifically, transistors Q152A and Q154A operate as a differential pair and transistors Q152B and Q154B operate as high impedance current buffers for transistors Q152A and Q154A respectively. The outputs from the differential amplifier of FIG. 3 are taken from the collectors of transistors Q152B and Q154B. The voltage difference between the outputs of the differential amplifier is an amplified version of the voltage drop across MR head MR150.

MR head MR150 is biased in a manner similar to that described for the MR head of FIG. 2. Current source I160 creates a current that is reflected by the transistors of block 160 onto the transistors of blocks 156 and 162. Block 160 contains two transistors Q160A and Q160B. The base of transistor Q160B and the collector of transistor Q160A are coupled to current source I160. Transistor Q16OB's collector is coupled to ground and its emitter is coupled to the base of transistor Q160A. The emitter of transistor Q160A is coupled to one terminal of resistor R160 which has its other terminal coupled to upper power supply $V_{CC}$. The emitter of transistor Q160B and the base of transistor Q160A are further coupled to the bases of transistors in blocks 156 and 162. Transistor Q160B improves the performance of the current mirrors produced between blocks 160, 156 and 162 by isolating current source I160 from the base currents of the transistors in each block. This isolation increases the amount of current actually reflected in the current mirror, by increasing the percentage of current from current source I160 that appears at the emitter of transistor Q160A.

Block 156, which contains transistors Q156A and Q156B, operates in conjunction with resistor R156 and capacitor C156 as a current source for the upper terminal of MR head MR150. These components act in a manner similar to transistor Q56, resistor R56 and capacitor C56 of FIG. 2. The only difference between the components of FIG. 2 and block 156, resistor R156 and capacitor C156 of FIG. 3 is that transistor Q156B has been inserted between the collector of transistor Q156A and the upper terminal of MR head MR 150. Transistor Q156B has its base coupled to reference voltage V156 and operates as a high-output-impedance current buffer for transistor Q156A. In preferred embodiments, transistors Q156A and Q156B are ten times larger than transistor Q160A and thus multiply the collector current of transistor Q160A by ten to produce the source current for the upper terminal of MR head MR150.

Block 162 and resistor R162 of FIG. 3 operate in a manner similar to that described for transistor Q62 and resistor R62 of FIG. 2. The only difference between block 162 and resistor R162 of FIG. 3 and the embodiment shown in FIG. 2 is the addition of transistor Q162B, which has its emitter coupled to the collector of transistor Q162A, its collector coupled to the collector of transistor Q164, and its base coupled to reference voltage V156. Transistor Q162B operates as a high-output-impedance current buffer for transistor Q162A, which operates as a current mirror with transistor Q160A. In preferred embodiments, transistors Q162A and Q162B are similar to transistor Q160A, and resistor R162 is similar to resistor R160 so that the current reflected in the collector of transistor Q162B is nearly identical to the collector current of transistor Q160A.

The collector of transistor Q162B is coupled to the collector and base of transistor Q164 and the base of transistor of Q158A. Transistor Q164 has its emitter coupled to one terminal of resistor R164 which has its other terminal connected to lower power supply $V_{EE}$. Capacitor C164 extends between the base of transistor Q164 and lower power supply $V_{EE}$. The emitter of transistor Q158A is coupled to one terminal of resistor R158 which has its other terminal coupled to lower power supply $V_{EE}$. Transistors Q164 and Q158A operate together to reflect the collector current of transistor Q162B to the collector of transistor Q158A in a manner similar to the way in which transistors Q64 and Q58 reflect the collector current of transistor Q62 in FIG. 2.

In preferred embodiments, transistor Q158A is ten times as large as transistor Q164 and resistor R158 is one-tenth the size of resistor R164. These ratios cause transistor Q164 and transistor Q158A to reflect a collector current into transistor Q158A that is ten times as large as the collector current in transistor Q162B.

The collector of transistor Q158A is coupled to the emitter of transistor Q158B, which operates as a high-output-impedance current buffer for transistor Q158A. Transistor Q158B's base is coupled to reference voltage V158, and its collector is coupled to the lower voltage terminal of MR head MR150. The collector current of transistor Q158B is nearly identical to the collector current of transistor Q158A but the output impedance of transistor Q158B is much greater than the output impedance of transistor Q158A.

From the relationships described above, it can be seen that the collector current of transistor Q160A is reflected into the collector current of transistor Q156A, Q156B, Q158A, and Q158B at an approximate gain of 10. Because of losses in the current mirrors created by transistors Q160A, Q162A, Q162B, Q164, and Q158A, the collector current in transistor Q158B may not match the collector current of transistor Q156B.

In FIG. 3, a feedback loop is used to adjust the collector current levels of transistors Q158B and Q156B so that the voltage at the collectors of transistors Q158B and Q156B have matched magnitudes and opposite polarities. The feedback loop begins at the two terminals of MR head MR 150 which are coupled together by a resistance bridge constructed from matching resistors R172 and R170 placed in series. The node between resistors R172 and R170 is coupled to one input of transconductance amplifier 174. Transconductance amplifier 174 includes a differential amplifier consisting of a differential pair of transistors Q180B and Q182B which are both buffered by input buffer transistors Q180A and Q182A respectively. Transistor Q180A has it emitter coupled to the base of transistor Q180B and to current source I180. Similarly, transistor Q182A has its emitter coupled to the base of transistor Q182B and to current source I182. Transistors Q180A and Q182A act as input gain stages to the differential pair transistors Q180B and Q182B respectively. The base of transistor Q180A is coupled to the resistance bridge; the base of transistor Q182A is coupled to ground.

Transistors Q180A and Q182A are coupled to base current compensator circuits, which provide base currents to transistors Q180A and Q180B so that they do not draw current from the resistance bridge and ground respectively. For transistor Q180A, the base current compensator circuit is constructed of NPN transistor Q184, and PNP transistors Q186A, Q186B, Q186C and Q186D. Transistor Q184 has it emitter coupled to the collector of transistor Q180A and its collector coupled to upper power supply $V_{CC}$. When active, transistor Q184's emitter current nearly matches the emitter current of transistor Q180A, resulting in Q184's base current nearly matching Q180A's base current. The collector of transistor Q186B is coupled to the base of transistor Q180A.

Transistors Q186A, Q186B, Q186C and Q186D act as a current mirror that reflects the base current of transistor Q184 to the base of transistor Q180A. Transistors Q186D and transistor Q186B are coupled together in a basic current mirror configuration with the collector of transistor Q186D coupled to the bases of transistors Q186B and Q186D. Transistors Q186A and Q186C simply increase the output resistance of transistors Q186D and Q186B. The collector of transistor Q186D is coupled to the base of transistor Q184. The collector and base of transistor Q186A is coupled to the emitter of transistor Q186B and the collector of transistor Q186C is coupled to the emitter of transistor Q186D. The emitters of both transistors 186A and 186C are tied to upper power supply $V_{CC}$. In preferred embodiments, transitions Q186A, Q186B, Q186C and Q186D are all similar to each other so that the current mirror has a gain of 1.

In operation, the base current of transistor Q184 is reflected through the collector current of transistor Q186D to the collector of transistor Q186B and thus into the base of transistor Q180A. Since the base current of transistor Q184 matches the base current of transistor Q180A, the current mirror of transistors Q186D and Q186B supply nearly all of the base current required by transistor Q180A.

Transistors Q188, Q190A, Q190B, Q190C, and Q190D are connected as a base-current compensation circuit for transistor Q182A. Transistor Q188's emitter is connected to the collector of transistor Q182A so that the emitter currents and base currents of both transistors are nearly identical. Transistors Q190D and Q190B reflect the base current of transistor Q188 to the base of transistor Q182A to supply nearly all of the base current required by transistor Q182A. Since the base-currents of transistors Q180A and Q182A are supplied by base current compensation circuits, these transistors do not draw current from the centerpoint of the resistance bridge or from ground.

The differential pair constructed from transistors Q180B and Q182B is biased by a current source constructed from transistor Q176 and resistor R176. Transistor Q176's collector is coupled the emitters of transistors Q180B and Q182B; it's emitter is coupled to one terminal of resistor R176 and its base is coupled to the bases of transistors Q164 and Q158A. In preferred embodiments, transistor Q176 is twice as large as transistor Q164; and resistor R176 has nearly one-half the resistance of resistor R164. This relationship causes transistors Q176 and Q164 to act as a current mirror reflecting the collector current in transistor Q164 to the collector of the transistor Q176 at a gain of two. Thus, the collector current of transistor Q176 is approximately twice the collector current of transistor Q164.

In the differential pair, the collector of transistor Q180B is coupled to the emitter of transistor Q156A and one terminal of resistor R156. Similarly, the collector of transistor Q182B is coupled to the emitter of transistor Q162A and one terminal of resistor R162.

When the magnitude of the collector current of transistor Q156B is too large relative to the current drawn by the collector of transistor Q158B, the voltage at the base of transistor Q180A rises above ground causing transistor Q180A to conduct more current. This causes transistor Q180B to conduct more current through its collector, resulting in an equivalent decrease in the collector current of transistor Q182B.

As the collector current of transistor Q180B increases, the voltage drop across resistor R156 increases causing a decrease in the emitter-base junction voltage of transistor Q156A. This reduces the collector currents of transistors Q156A and Q156B. The reduction of transistor Q182B's collector current causes the voltage drop across resistor R162 to decrease, increasing the emitter-base junction voltage across transistor Q162A. This increases the collector currents of transistors of Q162A and Q162B. Transistor Q162B's increased collector current is reflected by transistor Q164 to transistors Q158A and Q158B. Thus, the reduction in transistor Q182B's collector current results in an increase in the collector current of transistor Q158B. Thus, if transistor Q156B is producing too much current relative to transistor Q158B, the feedback loop of the present invention decreases the current produced by transistor Q156B and increases the current drawn by transistor Q158B.

If transistor Q156B does not produce enough current relative to transistor Q158B, the voltage at the base of transistor Q180A drops below ground. This causes transistor Q180B to conduct less collector current and transistor Q182B to conduct more collector current. The reduction in collector current of transistor Q180B causes the collector current of transistor Q156B to increase and the increase in collector current in transistor Q182B causes the collector current of transistor Q158B to decrease. Thus, if transistor Q156B is not producing enough current relative to transistor Q158B, the feedback loop of the present invention decreases the amount of current drawn by transistor Q158B and increase the amount of current produced by transistor Q156.

Although the present invention has been described with reference to preferred embodiments, workers skilled in the art will recognize that changes may be made in form and detail without departing from the spirit and scope of the invention.

What is claimed is:

1. A biasing circuit for current biasing a resistance load having a centerpoint, the biasing circuit comprising:

a first current source, coupled to a first end of the load to produce a first current, the first current source including a first transistor;

a second current source coupled to a second end of the load to produce a second current, the second current source including a current mirror;

an initiator circuit coupled to both the first and second current sources to initiate the first and second current sources to produce the first and second currents having respective first and second initial values; and a feedback circuit coupled across the load at the first and second ends of the load and responsive to voltages at the first and second ends, the feedback circuit being coupled to the first transistor and to the current mirror of the second current source to change the values of the first and second currents so that a voltage at the centerpoint is a desired value.

2. The biasing circuit of claim 1 wherein the feedback circuit controls first and second feedback currents to the first and second current sources respectively.

3. The biasing circuit of claim 2 wherein the feedback circuit comprises a transconductance amplifier, the transconductance amplifier controlling the first and second feedback currents in response to the voltage at the centerpoint.

4. The biasing circuit of claim 3 wherein the current mirror includes a driver transistor and a reflection transistor, the driver transistor and reflection transistor each having a base, collector and emitter, the base and collector of the drive transistor coupled to the base of the reflection transistor and the feedback circuit being connected to the second current source at the base and collector of the driver transistor.

5. The biasing circuit of claim 4 wherein the first and second feedback currents are divided from a main feedback current by the transconductance amplifier, the main feedback current taken from a main-current transistor, the main-current transistor having a collector, emitter and base, the collector of the main-current transistor coupled to the transconductance amplifier, and the base of the main-current transistor coupled to the base and collector of the driver transistor.

6. A biasing circuit for a sensing element having two terminals, the biasing circuit comprising:

a first current source having a first transistor having an emitter with an associated emitter current, the entire emitter current passing through a first feedback node, the first transistor having a collector coupled to a first of the two terminals of the sensing element to provide a first source current to the sensing element;

a second current source having a current mirror having a driver transistor and a reflection transistor, the driver transistor having a second feedback node and the reflection transistor having a controlled terminal coupled to a second of the two terminals of the sensing element to provide a second source current to the sensing element; and a transconductance circuit coupled across the two terminals of the sensing element and responsive to a voltage at each of the two terminals to provide a first feedback current to the first feedback node and a second feedback current to the second feedback node, the first and second feedback currents having values based on the voltages at the two terminals.

7. The biasing circuit of claim 6 wherein the first and second feedback currents are divided from a control current, the amount of current divided into each feedback current controlled by the transconductance circuit.

8. The biasing circuit of claim 6 further comprising an initiator circuit coupled to each current source at a point separate from the feedback nodes, the initiator circuit driving both current sources to produce currents having initial values which are modified by the feedback currents.

9. The biasing circuit of claim 7 wherein the control current is taken from a control transistor having a base, collector and emitter, the base of the control transistor coupled to a base and a collector and of the driver transistor.

10. In a computer disc drive, a magnetic-field sensing circuit comprising:

a sensing element having a first terminal and a second terminal forming a sensing circuit output, the sensing element being responsive to a sensor bias current and a magnetic field to provide first and second voltages at the first and second terminals the first and second voltages together being representative of the magnetic field;

first and second biasing circuits coupled to the respective first and second terminals, the first biasing circuit providing a first bias current to the sensing element when the first biasing circuit is active and the second biasing circuit providing a second bias current to the sensing element when the second biasing circuit is active;

a feedback circuit coupled to the sensing element and responsive to the first and second voltages to provide respective first and second feedback currents to the respective first and second terminals based on values of the first and second voltages; and an initiator circuit coupled to the first and second biasing circuits for activating both the first and second biasing circuits independently of the feedback circuit.

11. The sensing circuit of claim 10 wherein a first transistor in the first biasing circuit is connected to the first terminal and has at least one emitter with an associated emitter current when active, the entire emitter current passing through a first feedback node, the feedback circuit being connected to the first feedback node to provide the first feedback current to the first feedback node.

12. The sensing circuit of claim 10 wherein the second biasing circuit comprises a current mirror, the current mirror comprising an originating transistor and a reflector transistor, the originating transistor and reflector transistor each having a base, collector and emitter, the base and collector of the originating transistor coupled to the base of the reflector transistor, the reflector transistor being coupled to the second terminal and the feedback circuit being connected to a second feedback node at the base and collector of the originating transistor to provide the second feedback current to the second feedback node.

13. The sensing circuit of claim 10 wherein the feedback circuit comprises a transconductance amplifier which controls at least one feedback current in response to a measured voltage.

14. The sensing circuit of claim 13 wherein the first biasing circuit includes a first feedback node and the second biasing circuit includes a second feedback node and the transconductance amplifier controls the first feedback current at the first feedback node and the second feedback current at the second feedback node, the first and second feedback currents together forming a control current, the transconductance amplifier controlling the division of the control current into the first and second feedback currents.

15. The sensing circuit of claim 14 wherein the second biasing circuit comprises a current mirror having an originating transistor and a reflector transistor, each transistor having a base, collector and emitter, the base and collector of the originating transistor coupled to the base of the reflector transistor, the reflector transistor being coupled to the second terminal and the feedback circuit being connected to the second feedback node at the base and collector of the originating transistor to provide the second feedback current to the second feedback node, and wherein the control current passes through a control transistor having a base coupled to the base of the originating transistor.

16. The biasing circuit of claim 1 wherein the current mirror includes a driver transistor and a reflection transistor, the driver transistor and reflection transistor each having a base, collector and emitter, the base and collector of the drive transistor coupled to the base of the reflection transistor and the feedback circuit being connected to the second current source at the base and collector of the driver transistor.

17. The biasing circuit of claim 2 wherein the first feedback current is applied to an emitter of the first transistor.

18. The biasing circuit of claim 17 wherein the current mirror includes a driver transistor and a reflection transistor, the driver transistor and reflection transistor each having a base, collector and emitter, the base and collector of the drive transistor coupled to the base of the reflection transistor and the feedback circuit being connected to the second current source at the base and collector of the driver transistor.

19. The biasing circuit of claim 18 wherein the first and second feedback currents are divided from a main feedback current by the transconductance amplifier, the main feedback current taken from a main-current transistor, the main-current transistor having a collector, emitter and base, the collector of the main-current transistor coupled to the transconductance amplifier, and the base of the main-current transistor coupled to the base and collector of the driver transistor.

20. The sensing circuit of claim 11 wherein the second biasing circuit comprises a current mirror, the current mirror comprising an originating transistor and a reflector transistor, the originating transistor and reflector transistor each having a base, collector and emitter, the base and collector of the originating transistor coupled to the base of the reflector transistor, the reflector transistor being coupled to the second terminal and the feedback circuit being connected to the second feedback node at the base and collector of the originating transistor to provide the second feedback current to the second feedback node.

21. The sensing circuit of claim 14 wherein a first transistor in the first biasing circuit is connected to the first terminal and has at least one emitter with an associated emitter current when active, the entire emitter current passing through the first feedback node, the feedback circuit being connected to the first feedback node to provide the first feedback current to the first feedback node.

22. The sensing circuit of claim 21 wherein the second biasing circuit comprises a current mirror, the current mirror comprising an originating transistor and a reflector transistor, the originating transistor and reflector transistor each having a base, collector and emitter, the base and collector of the originating transistor coupled to the base of the reflector transistor, the reflector transistor being coupled to the second terminal and the feedback circuit being connected to the second feedback node at the base and collector of the originating transistor to provide the second feedback current to the second feedback node.

23. The sensing circuit of claim 14 wherein the second biasing circuit comprises a current mirror, the current mirror comprising an originating transistor and a reflector transistor, the originating transistor and reflector transistor each having a base, collector and emitter, the base and collector of the originating transistor coupled to the base of the reflector transistor, the reflector transistor being coupled to the second terminal and the feedback circuit being connected to the second feedback node at the base and collector of the originating transistor to provide the second feedback current to the second feedback node.

24. The sensing circuit of claim 15 wherein a first transistor in the first biasing circuit is connected to the first terminal and has at least one emitter with an associated emitter current when active, the entire emitter current passing through the first feedback node, the feedback circuit being connected to the first feedback node to provide the first feedback current to the first feedback node.

* * * * *

UNITED STATES PATENT AND TRADEMARK OFFICE
CERTIFICATE OF CORRECTION

PATENT NO. : 5,834,952
DATED : Nov. 10, 1998
INVENTOR(S) : Tuan V. Ngo

It is certified that error appears in the above-identified patent and that said Letters Patent is hereby corrected as shown below:

Col. 5, line 9, delete "160", insert --I60--

Col. 5, line 13, delete "160", insert --I60--

Col. 5, line 23, delete "062", insert --Q62--

Signed and Sealed this

Seventh Day of September, 1999

Attest:

Q. TODD DICKINSON

Attesting Officer

Acting Commissioner of Patents and Trademarks